United States Patent
Hsu (10) Patent No.: US 10,027,318 B2
(45) Date of Patent: Jul. 17, 2018

(54) TRANSMISSION CIRCUIT WITH LEAKAGE PREVENTION CIRCUIT

(71) Applicant: Realtek Semiconductor Corp., HsinChu (TW)

(72) Inventor: Heng-Chia Hsu, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 15/451,417

(22) Filed: Mar. 7, 2017

(65) Prior Publication Data

US 2017/0179942 A1 Jun. 22, 2017

Related U.S. Application Data

(63) Continuation of application No. 14/801,841, filed on Jul. 17, 2015, now Pat. No. 9,628,069.

(30) Foreign Application Priority Data

Jul. 17, 2014 (TW) .............................. 103124585 A (51) Int. Cl.
*H03K 17/16* (2006.01)
(52) U.S. Cl.
CPC ................................. *H03K 17/161* (2013.01)
(58) Field of Classification Search
CPC ............................ H03K 17/161; H03K 3/012
USPC ........ 327/382, 108–112, 427, 378, 379, 434, 327/437; 326/82, 83, 87
See application file for complete search history.

(56) References Cited

U.S. PATENT DOCUMENTS

| 6,107,882 A * | 8/2000 | Gabara | ............... H03F 3/45183 330/253 |
|---|---|---|---|
| 2008/0088342 A1* | 4/2008 | Lee | ............... H03K 19/018528 326/83 |
| 2012/0146427 A1 | 6/2012 | Yeh | |

FOREIGN PATENT DOCUMENTS

| TW | M343259 | 10/2008 |
| TW | 201206073 | 2/2012 |

\* cited by examiner

*Primary Examiner* — Thomas Skibinski
(74) *Attorney, Agent, or Firm* — Winston Hsu (57) ABSTRACT

A transmission circuit includes: a first transistor, a first current source, a third transistor. The first transistor has a source terminal coupled to a first reference voltage terminal of the transmission circuit and a drain terminal coupled to a first output terminal of the transmission circuit. The first current source is coupled between a gate terminal of the first transistor and a second reference voltage terminal of the transmission circuit. The third transistor has a drain terminal coupled to the first output terminal of the transmission circuit, a source terminal coupled to the second reference voltage terminal of the transmission circuit, and a gate terminal for receiving a first input signal. The first transistor is of a first conducting type, and the second transistor is of a second conducting type different from the first conducting type.

7 Claims, 6 Drawing Sheets

TRANSMISSION CIRCUIT WITH LEAKAGE PREVENTION CIRCUIT

CROSS REFERENCE TO RELATED APPLICATIONS

This application is a continuation application of and claims the benefit of U.S. patent application Ser. No. 14/801,841, filed Jul. 17, 2015.

BACKGROUND OF THE INVENTION

1. Field of the Invention

The disclosed embodiments of the present invention relate to the FIELD of circuit design, and more particularly, to transmission circuits featuring leakage prevention.

2. Description of the Prior Art

In special cases, current may flow through a leakage path from a receiving end such as a front-end receiving circuit of a High Definition Multimedia Interface (HDMI) port of a monitor or television, across a transmission line (e.g. an HDMI cable), to a transmission end such as a front-end transmission circuit of an HDMI port of a notebook or a computer. In a typical case, the receiving end is powered on before the transmission end. Even disregarding the power consumption issue, this is harmful to a circuit because electrode migration may take place, which will damage the circuit to some degree when the circuit remains in such a state for a period of time.

Figure 1:
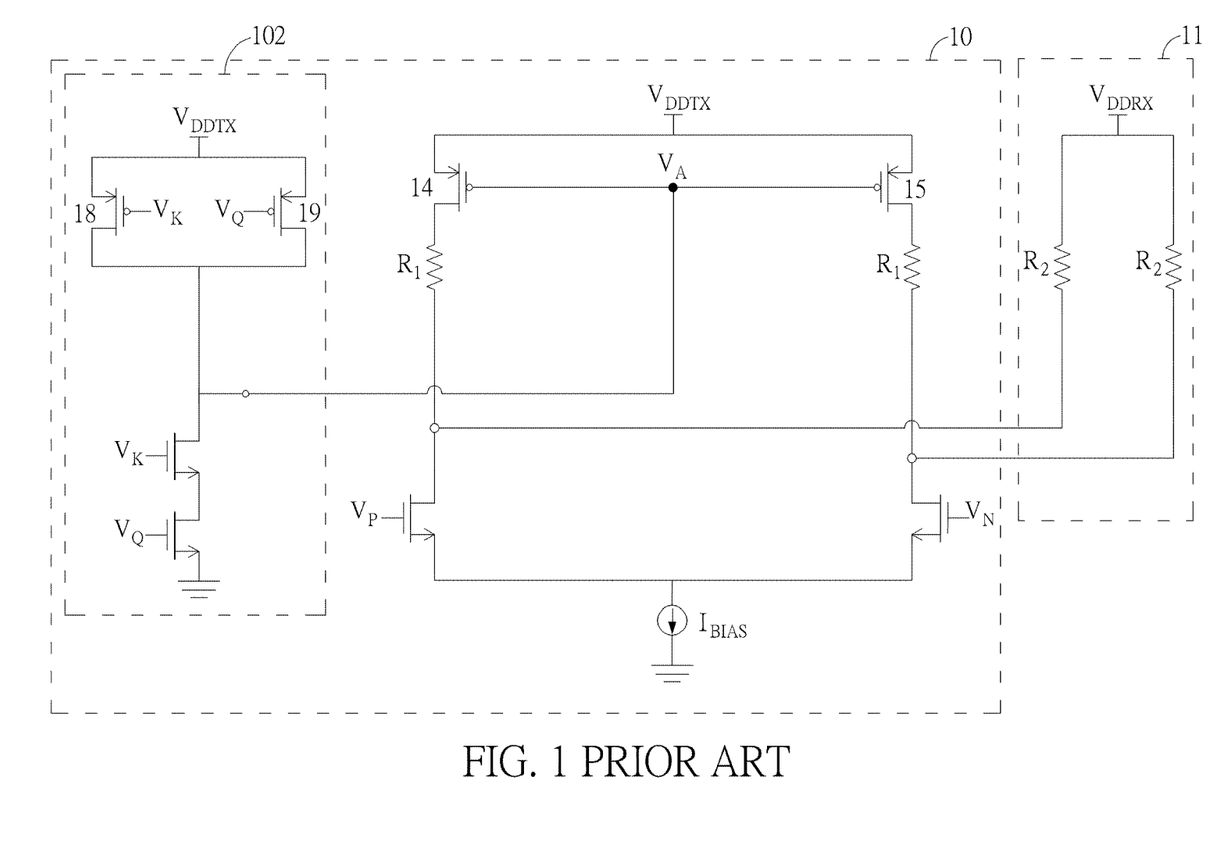
FIG. 1 is a circuit diagram illustrating a transmission end connected to a receiving end.

FIG. 1 is a circuit diagram illustrating a transmission end 10 connected to a receiving end 11. The transmission end 10 is a conventional design. When a voltage source $V_{DDRX}$ of the receiving end 11 is powered on but a voltage source $V_{DDTX}$ of the transmission end 10 is not powered on, the voltage source $V_{DDTX}$ will be pulled close to 0 v for a period of time. The logical value of a control signal $V_A$ is determined by a logical circuit 102, and transistors 18 and 19 are turned on in response to low input voltages $V_K$ and $V_Q$. The non-powered voltage source $V_{DDTX}$ slowly pulls a control voltage $V_A$ to 0 v, and finally transistors 14 and 15 are turned on although they should remain cut-off. Normally, equivalent impedances of resistors $R_1$, $R_2$ and transistors 14, 15 are small, so the path from the voltage source $V_{DDRX}$ of the receiving end 11 to the voltage source $V_{DDTX}$ of the transmission end 10 has low impedance. In this situation, current leakage may occur in the receiving end 11 as a result of the transmission end 10 extracting a large current from the receiving end 11, which can be determined by Ohm's law.

In light of the above, there is a need for a novel design to solve this leakage issue.

SUMMARY OF THE INVENTION

One of the objectives of the present invention is to provide transmission circuits featuring leakage prevention in order to solve the aforementioned issues.

According to a first aspect of the present invention, a transmission circuit is disclosed. The transmission circuit comprises a first transistor, a second transistor and a third transistor. The first transistor has a source terminal coupled to a first reference voltage terminal of the transmission circuit and a drain terminal coupled to a first output terminal of the transmission circuit. The second transistor has a source terminal coupled to a gate of the first transistor, and a drain terminal coupled to the first output terminal of the transmission circuit. The third transistor has a drain terminal coupled to the first output terminal of the transmission circuit, a source terminal coupled to a second reference voltage terminal of the transmission circuit, and a gate terminal for receiving a first input signal. The first and second transistors are of a first conducting type, and the third transistor is of a second conducting type different from the first conducting type.

Preferably, the first transistor and the second transistor of the first conducting type are P-channel MOS transistors, and the third transistor of the second conducting type is an N-channel MOS transistor.

According to a second aspect of the present invention, a transmission circuit is disclosed. The transmission circuit comprises a first transistor, a first current source and a second transistor. The first transistor has a source terminal coupled to a first reference voltage terminal of the transmission circuit and a drain terminal coupled to a first output terminal of the transmission circuit. The first current source is coupled between a gate terminal of the first transistor and a second reference voltage terminal of the transmission circuit. The second transistor has a drain terminal coupled to the first output terminal of the transmission circuit, a source terminal coupled to the second reference voltage terminal of the transmission circuit, and a gate terminal for receiving a first input signal. The first transistor is of a first conducting type, and the second transistor is of a second conducting type different from the first conducting type.

Preferably, the first transistor and the second transistor of the first conducting type are P-channel MOS transistors, and the second transistor of the second conducting type is an N-channel MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but same in functions. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 2:
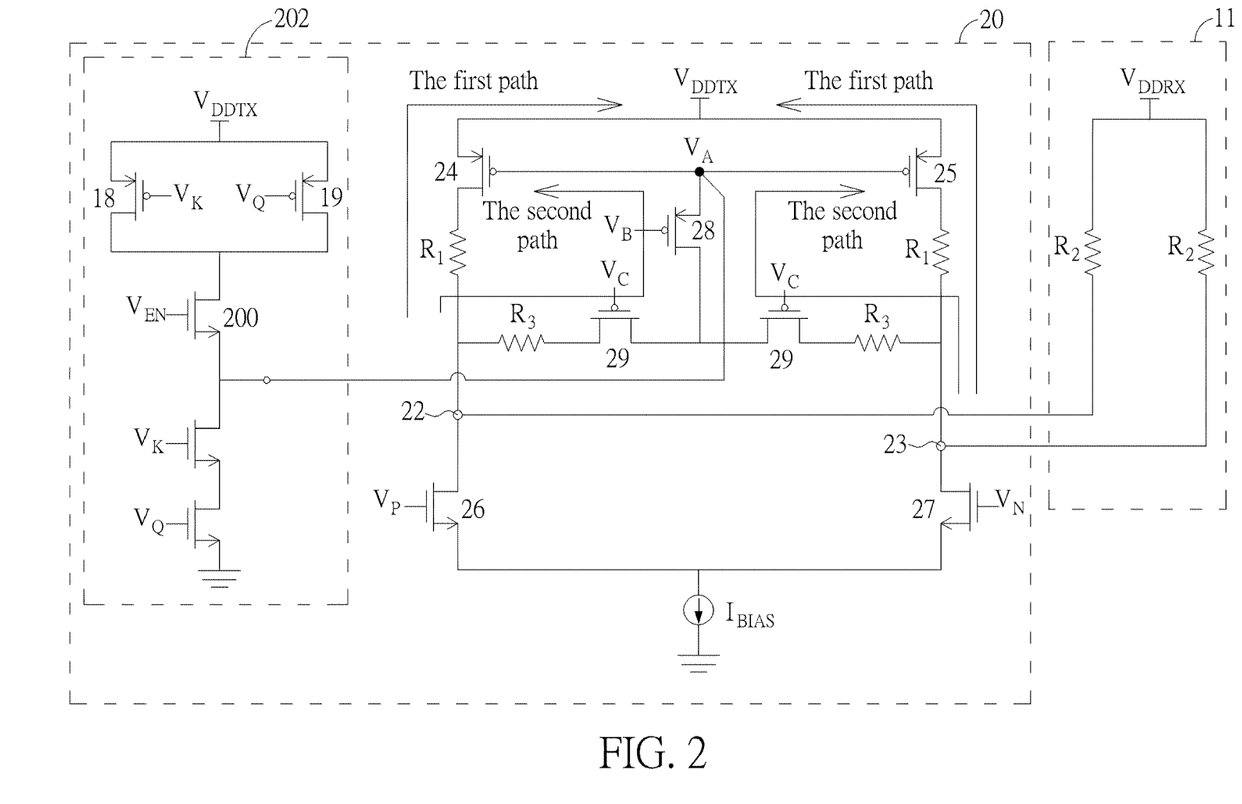
FIG. 2 is a circuit diagram illustrating a transmission circuit with a leakage prevention circuit according to a first embodiment of the present invention.

FIG. 2 is a circuit diagram illustrating a transmission circuit with a leakage prevention circuit according to a first embodiment of the present invention. A transmission end 20 is powered by a voltage source $V_{DDTX}$, and a receiving end 11 (which is the same as that illustrated in FIG. 1) is powered by a voltage source $V_{DDRX}$. The transmission end 20 is biased by a current source $I_{BIAS}$. The concept of the invention is to alleviate the leakage current issue occurring in the conventional transmission end. For convenience, the transmission end 20 is illustrated as a front-end transmission circuit of a High Definition Multimedia Interface (HDMI) port; and the receiving end 11 is illustrated as a front-end receiving circuit of an HDMI port in this embodiment. The transmission end 20 communicates with the receiving end 11 via output pads 22, 23 and an HDMI cable or a wire on a printed circuit board (PCB). Resistors $R_1$ and $R_2$ are termination resistors for, respectively, the transmission end 20 and the receiving end 11. Transistors 24 and 25 are P-channel Metal Oxide Semiconductors (PMOS) in charge of switching the termination resistor $R_1$. The transistors 24 and 25 are controlled by a control signal $V_A$. In a normal mode, when the control signal $V_A$ is logic 0, the transistors 24 and 25 will be turned on; else when the control signal $V_A$ becomes logic 1, the transistors 24 and 25 will remain cut-off. Further, the logical value of the control signal $V_A$ is determined by a logical circuit 202. For brevity, the logical circuit 202 is powered by the voltage source $V_{DDTX}$ in this embodiment, but this is not a limitation of the invention. Transistors 26 and 27 are N-channel Metal Oxide Semiconductors (NMOS). A differential input signal pair $V_P$ and $V_N$ of the transmission end 20 are respectively fed to gate particular terminals of the transistors 26 and 27. Note that the invention is not limited to the field of HDMI differential transmission circuits.

A particular case is when the receiving end 11 is powered on but the transmission end 20 is not. In order to avoid the transistors 24 and 25 from being turned on and forming a leakage path from the voltage source $V_{DDRX}$ of the receiving end 11 to the voltage source $V_{DDTX}$ of transmission end 20, transistors 28, 29 and a resistor $R_3$ are employed as a leakage prevention circuit. Specifically, when said particular case remains for a period of time, a gate terminal voltage $V_C$ of the transistor 29 and a gate terminal voltage $V_B$ of the transistor 28 will be pulled close to 0 v. At that point, when seen from the output terminals 22 and 23, two paths may be obtained: a first path from the output terminals 22 and 23, via the resistor $R_1$, the transistors 24 or 25, to the voltage source $V_{DDTX}$; and a second path from the output terminals 22 and 23, via the resistor $R_3$, the transistor 29, to the transistor 28. Since a capacitor is usually configured as a regulator between the voltage source $V_{DDTX}$ and the ground voltage, and taking into account the parasitic capacitance effects, the equivalent capacitance of the voltage source $V_{DDTX}$ is much larger than the parasitic capacitance formed at the path from the output terminals 22 or 23 to the transistor 28 via the resistor $R_3$ and the transistor 29. As a result, the RC time constant of the first path is much larger than that of the second path. A gate terminal voltage $V_B$ of the transistor 28 and a gate terminal voltage $V_C$ of the transistor 29 will be pulled close to 0 v after the transmission end 20 remains at the particular case for a period of time. Once the transistors 28 and 29 are turned on, the voltage source $V_{DDRX}$ of the receiving end 11 will pull the voltage $V_A$ up to a high voltage level, which will turn the transistors 24 and 25 off. The first path is open and therefore avoids a leakage situation.

It may be operable to turn off the transistor 28 in the normal mode in order to separate the control signal $V_A$ and the voltage source $V_{DDRX}$. The resistor $R_3$ may be designed to provide impedance matching and/or electrostatic discharge (ESD) protection in order to preserve the transistor 29. In practice, any similar means may be adopted, i.e., the transistor 28 is an essential component, but the resistor $R_3$ and the transistor 29 are optional components.

Referring to FIG. 2 in conjunction with FIG. 1 it can be seen that, compared to the prior art, the logical circuit 202 for generating the control signal $V_A$ is different from the logical circuit 102 by including an extra NMOS transistor 200. When the voltage source $V_{DDTX}$ is powered off, the control signal $V_{EN}$ of the NMOS transistor 200 will be close to logic 0. A weak pull down circuit may be adopted on the control signal $V_{EN}$ of the NMOS transistor 200. The transistor 200 is for avoiding a situation where the leakage path is formed between the voltage source $V_{DDRX}$ and the voltage source $V_{DDTX}$ via the second path and the transistors 18 and 19 when the receiving end 11 is powered on and the transmission end 20 is not. In order to meet different requirements, different designs of the logical circuit 202, other than that is explicitly shown in FIG. 2, are also contemplated. For example, despite of the differential architecture of the transmission end 20, a logical circuit having single-ended architecture is also available for use in controlling the transmission end 20.

Figure 3:
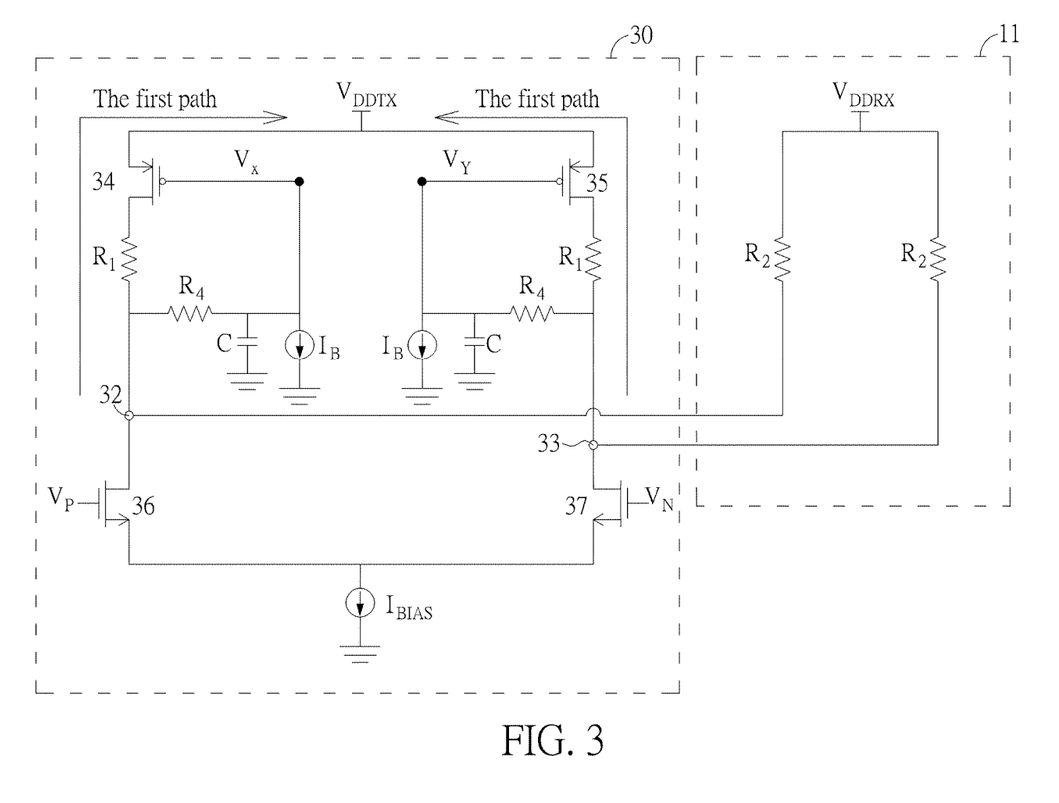
FIG. 3 is a circuit diagram illustrating a transmission circuit with a leakage prevention circuit according to a second embodiment of the present invention.

FIG. 3 is a circuit diagram illustrating a transmission circuit with a leakage prevention circuit according to a second embodiment of the present invention. A transmission end 30 is powered by a voltage source $V_{DDTX}$, and a receiving end 11 (the same as that illustrated in FIG. 1) is powered by a voltage source $V_{DDRX}$. The transmission end 30 is biased by a current source $I_{BIAS}$. The concept of the invention is also to alleviate the leakage current issue occurring in the conventional transmission end. For convenience, the transmission end 30 is illustrated as a front-end transmission circuit of an HDMI port; and the receiving end 11 is illustrated as a front-end receiving circuit of an HDMI port in the embodiment. The transmission end 30 communicates with the receiving end 11 via output pads 32, 33 and an HDMI cable or a wire on a PCB. Resistors $R_1$ and $R_2$ are termination resistors for the transmission end 30 and the receiving end 11, respectively. Transistors 34 and 35 are PMOS transistors in charge of switching the termination resistor $R_1$. The transistors 34 and 35 are controlled by control signals $V_X$ and $V_Y$, respectively. In a normal mode, when the control signal $V_X$ and the control signal $V_Y$ are both logic 0, the transistors 34 and 35 will be turned on; else when the control signal $V_A$ and the control signal $V_Y$ both become logic 1, the transistors 34 and 35 will remain cut-off. Transistors 36 and 37 are NMOS transistors. A differential input signal pair $V_P$ and $V_N$ of the transmission end 30 are respectively fed to gate terminals of the transistors 36 and 37. Note that the invention is not limited to the field of HDMI differential transmission circuits.

A particular case is when the receiving end 11 is powered on but the transmission end 30 is not. In order to prevent the transistors 34 and 35 from being turned on and forming a leakage path from the voltage source $V_{DDRX}$ of the receiving end 11 to the voltage source $V_{DDTX}$ of the transmission end 30, at least a power source $I_B$ is employed as a leakage prevention circuit. Specifically, when said particular case remains for a period of time, the power source $I_B$ is unable to provide a current and is regarded as floating. The capacitor C is then charged by the voltage source $V_{DDRX}$ so that the voltage source $V_{DDRX}$ of the receiving end pulls the voltages of the control signals $V_X$ and $V_Y$ to logic 1. The transistors 34 and 35 will be turned off and a first path passing through the resistor $R_1$ and transistors 34 or 35 to voltage source $V_{DDTX}$ is open. In this way, the first path is open and can avoid a leakage situation.

Figure 4:
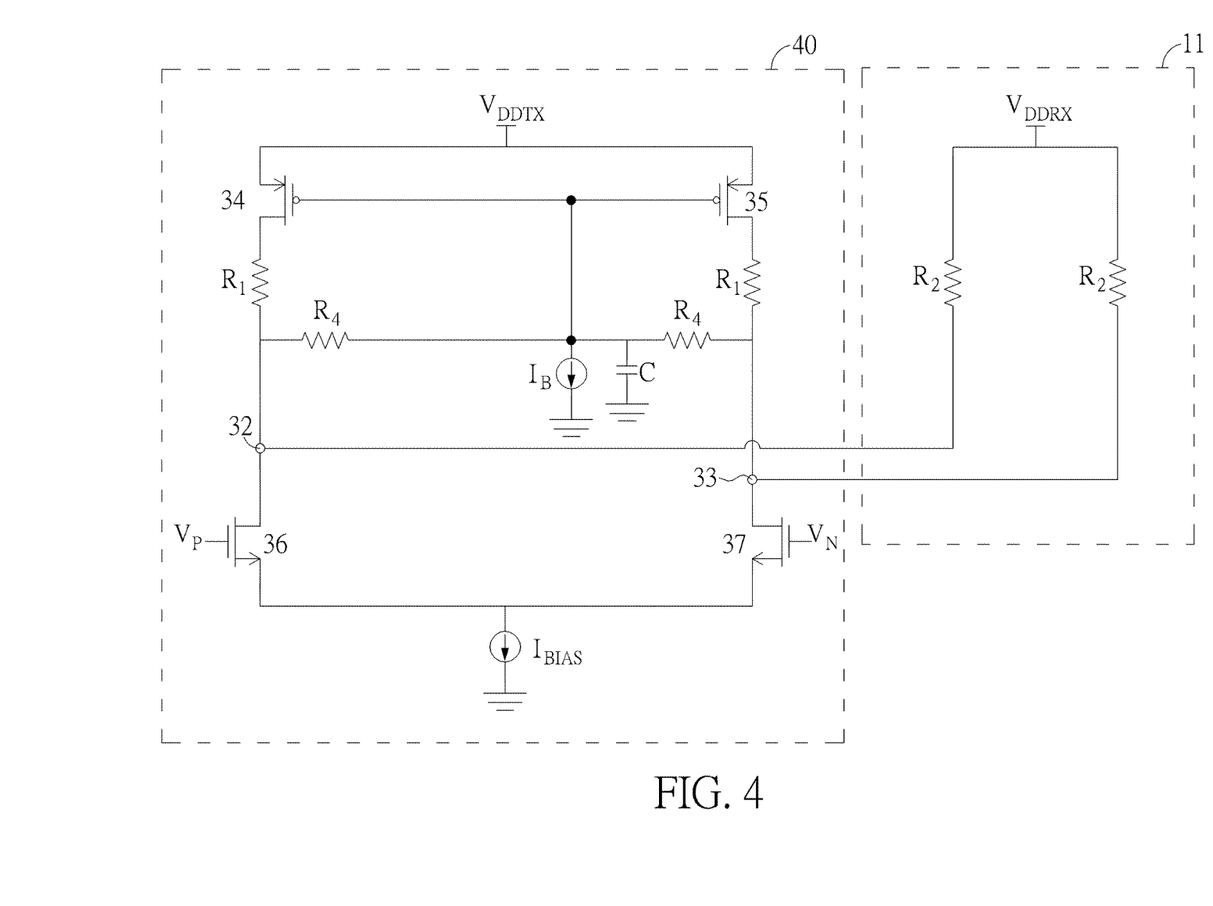
FIG. 4 is a circuit diagram illustrating a transmission circuit with a leakage prevention circuit according to a third embodiment of the present invention.

When the voltage source $V_{DDTX}$ of the transmission end 30 is powered on, the current $I_B$ will produce a small current and the voltage levels of the control signals $V_X$ and $V_Y$ will be pulled low, turning on the transistors 34 and 35. The conduction of the transistors 34 and 35 may be determined by controlling the current source $I_B$, thus avoiding the leakage situation. Designs of the resistor $R_4$ and the capacitor C may depend on practical implementations. FIG. 4 is a circuit diagram illustrating a transmission circuit with a leakage prevention circuit according to a third embodiment of the present invention. A transmission end 40 is an alternative design of FIG. 3. Specifically, the control signals $V_X$ and $V_Y$ are combined together. In this way, only one set of current source $I_B$ and capacitor C is required in the transmission end 40 instead of using two sets, as shown in FIG. 3.

Figure 5:
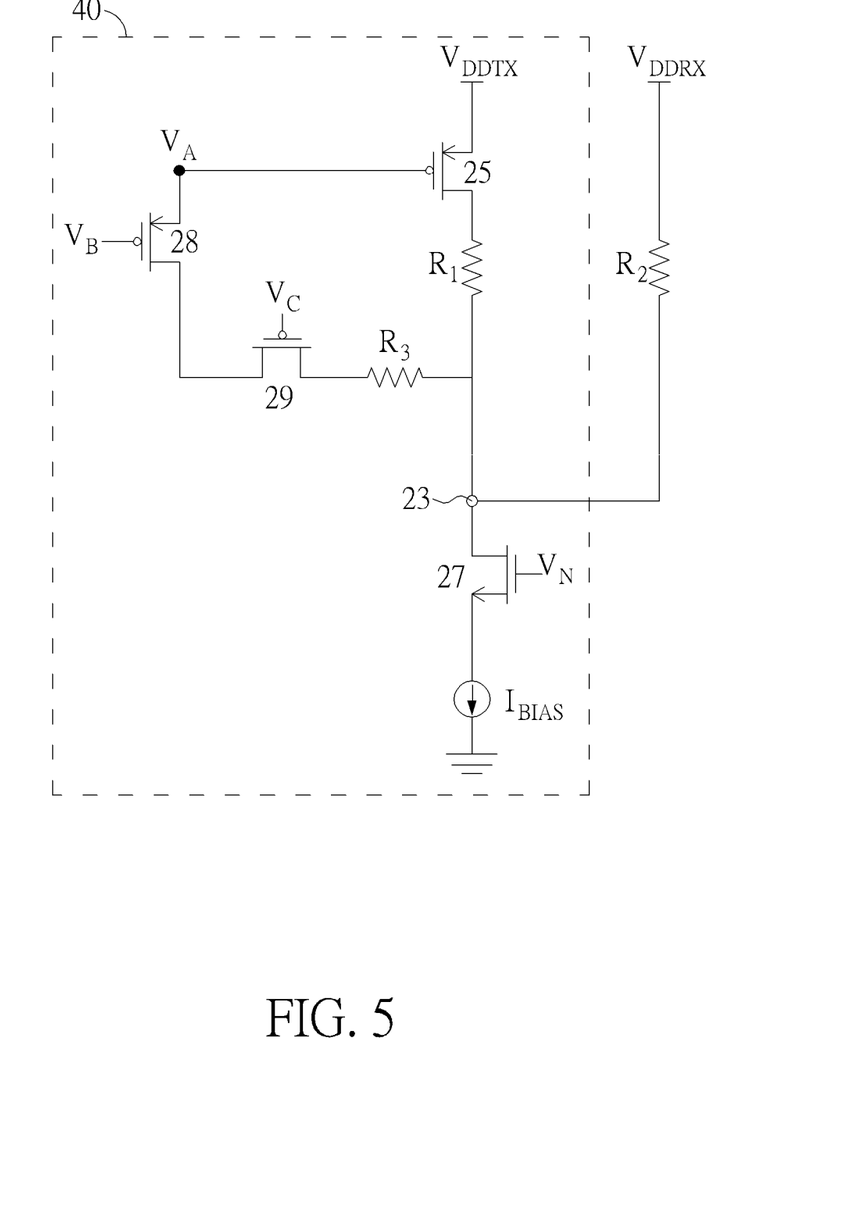
FIG. 5 and FIG. 6 respectively illustrate single-ended versions of the transmission ends 20 and 30 of FIG. 2 and FIG. 3.
Figure 6:
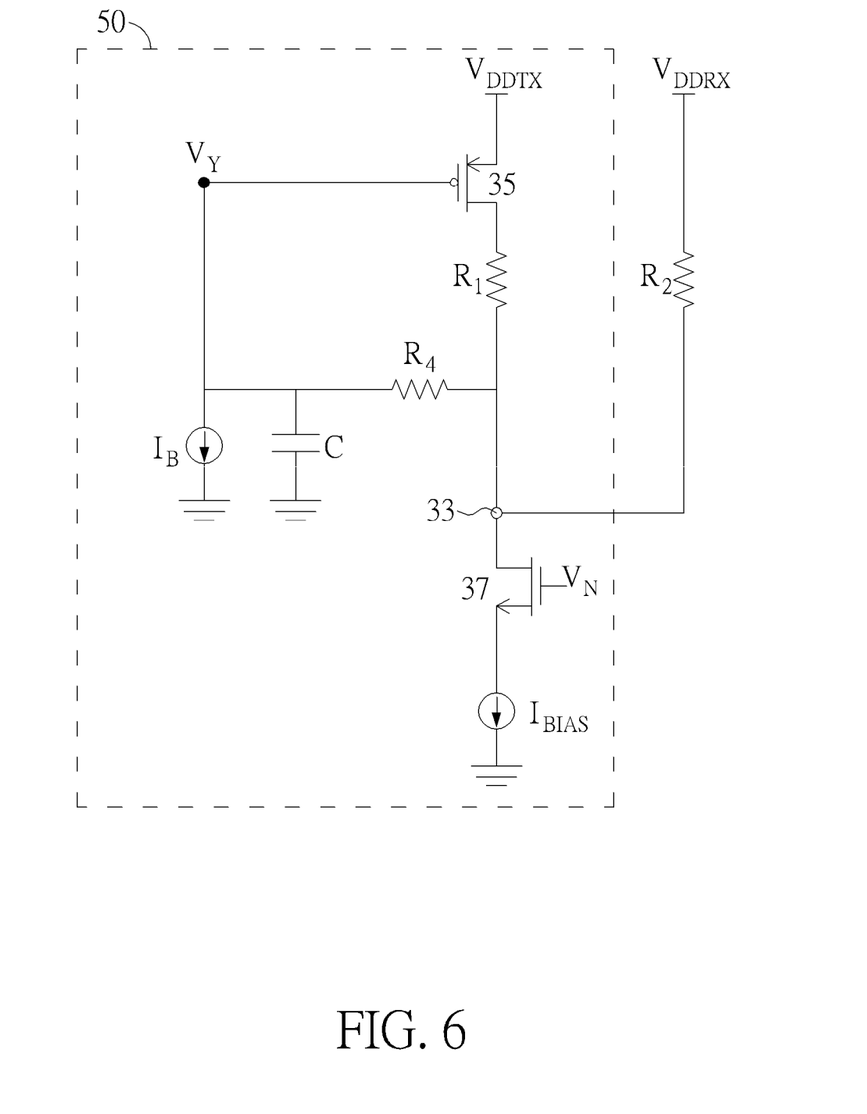

Single-ended versions of the transmission ends 20 and 30 are also contemplated according to various embodiments of the present invention. FIG. 5 and FIG. 6 respectively illustrate single-ended versions 40 and 50 of transmission ends 20 and 30. Such transmission ends can be applied in a single-ended signaling data communication system.

In particular, it is envisaged that the aforementioned inventive concept can be applied by a semiconductor manufacturer to any integrated circuit. It is further envisaged that, for example, a semiconductor manufacturer may employ the inventive concept in the design of a stand-alone device, or application-specific integrated circuit (ASIC) and/or any other sub-system element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Thus, an improved electronic device has been described, wherein the aforementioned disadvantages of the prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmission circuit, comprising:
   a first transistor, having a source terminal coupled to a first reference voltage terminal of the transmission circuit and a drain terminal coupled to a first output terminal of the transmission circuit;
   a first current source, coupled between a gate terminal of the first transistor and a second reference voltage terminal of the transmission circuit;
   a second transistor, having a drain terminal coupled to the first output terminal of the transmission circuit, a source terminal coupled to the second reference voltage terminal of the transmission circuit, and a gate terminal for receiving a first input signal;
   a first capacitor, coupled between the gate terminal of the first transistor and the second reference voltage terminal; and
   wherein the first transistor is of a first conducting type, and the second transistor is of a second conducting type different from the first conducting type;
   wherein the first capacitor is charged to pull up a voltage level of the gate terminal of the first transistor thereby to turn off the first transistor when a voltage source coupled to the first reference voltage terminal of the transmission circuit is not powered on; and the first capacitor is discharged by the first current source to pull down the voltage level of the gate terminal of the first transistor thereby to turn on the first transistor when the voltage source coupled to the first reference voltage terminal of the transmission circuit is powered on.

2. The transmission circuit of claim 1, wherein the first current source is arranged to be a leakage prevention circuit.

3. The transmission circuit of claim 2, wherein when a receiving circuit is coupled to the transmission circuit, and a voltage source of the receiving circuit is powered on and another voltage source coupled to the first reference voltage terminal of the transmission circuit is not powered on, the leakage prevention circuit prevents a leakage path from being formed from the voltage source of the receiving circuit to the voltage source of the first reference voltage terminal of the transmission circuit.

4. The transmission circuit of claim 1, further comprising:
   a first resistor, coupled between the first output terminal and the gate terminal of the first transistor.

5. The transmission circuit of claim 4, further comprising:
   a third transistor, having a gate terminal coupled to the gate terminal of the first transistor, a source terminal coupled to the first reference voltage terminal of the transmission circuit, and a drain terminal coupled to a second output terminal of the transmission circuit; and
   a fourth transistor, having a drain terminal coupled to the second output terminal of the transmission circuit, a source terminal coupled to the second reference voltage terminal of the transmission circuit, and a gate terminal for receiving a second input signal, wherein the first input signal and the second input signal form a differential signal pair;
   wherein the third transistor is of the first conducting type, and the fourth transistor is of the second conducting type.

6. The transmission circuit of claim 1, further comprising:
   a third transistor, having a source terminal coupled to the first reference voltage terminal of the transmission circuit and a drain terminal coupled to a second output terminal of the transmission circuit;
   a fourth transistor, having a drain terminal coupled to the second output terminal of the transmission circuit, a source terminal coupled to the second reference voltage terminal of the transmission circuit, and a gate terminal for receiving a second input signal, wherein the first input signal and the second input signal form a differential signal pair; and
   a second current source, coupled between a gate terminal of the third transistor and the second reference voltage terminal of the transmission circuit;
   wherein the third transistor is of the first conducting type, and the fourth transistor is of the second conducting type.

7. The transmission circuit of claim 6, further comprising:
   a first resistor, coupled between the first output terminal and the gate terminal of the first transistor;

a second resistor, coupled between the second output terminal and the gate terminal of the third transistor; and
a second capacitor, coupled between the gate terminal of the third transistor and the second reference voltage terminal.

* * * * *